United States Patent
Bogner

(10) Patent No.: US 8,071,987 B2
(45) Date of Patent: Dec. 6, 2011

(54) HOUSING FOR AN OPTOELECTRONIC COMPONENT, OPTOELECTRONIC COMPONENT, AND METHOD FOR PRODUCING A HOUSING FOR AN OPTOELECTRONIC COMPONENT

(75) Inventor: Georg Bogner, Lappersdorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 155 days.

(21) Appl. No.: 12/443,160

(22) PCT Filed: Sep. 27, 2007

(86) PCT No.: PCT/DE2007/001750
§ 371 (c)(1),
(2), (4) Date: Mar. 26, 2009

(87) PCT Pub. No.: WO2008/040324
PCT Pub. Date: Apr. 10, 2008

(65) Prior Publication Data
US 2009/0218584 A1    Sep. 3, 2009

(30) Foreign Application Priority Data
Sep. 29, 2006  (DE) .......................... 10 2006 046 678

(51) Int. Cl.
*H01L 33/00* (2010.01)

(52) U.S. Cl. .............. 257/81; 257/98; 257/99; 257/100; 257/684; 257/690; 257/696; 257/E23.031; 257/E23.061; 257/E21.499; 257/E21.5; 257/E21.501; 257/E21.502; 438/25; 438/26; 438/106; 438/123; 438/124

(58) Field of Classification Search .................... 257/81, 257/98, 99, 100, 433, 434, 437, 684, 687, 257/690, 693, 696, E21.499, E21.5, E21.501, 257/E21.502, E23.058, E23.031, E23.61, 257/678; 438/111, 112, 125, 25, 26, 106, 438/123, 124
See application file for complete search history.

(56) References Cited

U.S. PATENT DOCUMENTS

| | | | |
|---|---|---|---|
| 5,040,868 | A | 8/1991 | Waitl et al. |
| 5,291,038 | A | 3/1994 | Hanamoto et al. |
| 6,066,861 | A | 5/2000 | Höhn et al. |
| 6,376,902 | B1 | 4/2002 | Arndt |
| 6,624,491 | B2 | 9/2003 | Waitl et al. |
| 6,800,996 | B2 | 10/2004 | Nagai et al. |
| 6,806,509 | B2 | 10/2004 | Yoshino et al. |
| 7,138,301 | B2 | 11/2006 | Waitl et al. |

(Continued)

FOREIGN PATENT DOCUMENTS
DE    199 45 919 A1    3/2000
(Continued)

*Primary Examiner* — Benjamin Sandvik
*Assistant Examiner* — Farid Khan
(74) *Attorney, Agent, or Firm* — Slater & Matsil, L.L.P.

(57) ABSTRACT

A housing for an optoelectronic component is disclosed, having a plastic base body that has a front side with an assembly region for at least one radiation emitting or radiation detecting body, wherein the plastic base body is formed from at least one first plastic component and at least one second plastic component. The second plastic component is disposed on the front side of the plastic base body, and is formed from a material that differs from the first plastic component in at least one optical property, and forms an optically functional region of the plastic base body. Further, a method for producing a housing for an optoelectronic component and a light emitting diode component is disclosed.

15 Claims, 1 Drawing Sheet

U.S. PATENT DOCUMENTS

| | | |
|---|---|---|
| 2003/0141510 A1 | 7/2003 | Brunner et al. |
| 2004/0046222 A1* | 3/2004 | Nagai et al. ............. 257/433 |
| 2004/0075100 A1 | 4/2004 | Bogner et al. |
| 2005/0196710 A1* | 9/2005 | Shiroguchi ............. 430/322 |
| 2005/0245018 A1 | 11/2005 | Bogner et al. |
| 2006/0060867 A1 | 3/2006 | Suehiro |
| 2006/0138442 A1 | 6/2006 | Waitl et al. |
| 2006/0157722 A1 | 7/2006 | Takezawa et al. |
| 2006/0255355 A1* | 11/2006 | Brunner et al. ............ 257/98 |
| 2006/0263554 A1* | 11/2006 | Yamada et al. ........... 428/35.7 |
| 2008/0173878 A1 | 7/2008 | Waitl et al. |
| 2008/0265266 A1 | 10/2008 | Bogner et al. |
| 2010/0219349 A1* | 9/2010 | Furuichi et al. ............ 250/366 |

FOREIGN PATENT DOCUMENTS

| | | |
|---|---|---|
| EP | 0 493 051 A1 | 7/1992 |
| EP | 0 646 971 B1 | 4/1995 |
| EP | 1 022 787 B1 | 7/2000 |
| JP | 2000-101149 A | 4/2000 |
| JP | 2000-101149 * | 7/2000 |
| WO | WO 99/07023 | 2/1999 |
| WO | WO 00/02262 | 1/2000 |
| WO | WO 02/084749 A2 | 10/2002 |
| WO | WO 2006/032251 A1 | 3/2006 |

* cited by examiner

HOUSING FOR AN OPTOELECTRONIC COMPONENT, OPTOELECTRONIC COMPONENT, AND METHOD FOR PRODUCING A HOUSING FOR AN OPTOELECTRONIC COMPONENT

This patent application claims the priority of the German patent application 10 2006 046 678.0 filed Sep. 29, 2006, whose disclosed content is hereby incorporated by reference.

TECHNICAL FIELD

The invention relates to a housing for an optoelectronic component, in particular a surface mountable optoelectronic component, with a plastic base body, which has a front side with a mounting region for at least one radiation emitting or radiation detecting body. Further, the invention relates in particular to a surface mountable optoelectronic component, and a method for producing a housing for an optoelectronic component.

BACKGROUND

Housings of the initially named type are described, for example, in the patent documents EP 1022787 B1, EP 00646971 B1, WO 99/07023 A1, WO 00/02262 A1 and WO 02/084749 A2. These documents describe so-called pre-housed lead frame designs, in which a plastic base body, which is constructed as one piece, and which is formed around the electrical connections of the lead frame (also called electrical lead frames), is in practice manufactured from a white, reflecting thermoplastic material.

However, for a series of applications, these known plastic base bodies do not have sufficiently satisfactory optical properties. Thus, for example, for use in video displays, the contrast of the light spots relative to the surrounding housing surface is often too low.

One approach to this problem is to subsequently imprint the surface of the plastic base body, for example, with black pigment. Here, however, there exists the risk of color inhomogeneity in the pigment layer, and also of insufficient color stability and/or paint flaking under the influence of different environmental conditions.

SUMMARY

In one aspect the present invention provides a housing of the initially named type, with which desired optical properties of the housing surface can be obtained in an improved way. Further, a method is disclosed for producing such a housing.

In a housing according to the invention, the plastic base body is constructed from at least one first plastic component and at least one second plastic component. In this arrangement, the second plastic component is located at the front side of the plastic base body, and is constructed from a material that differs from the material of the first plastic component in at least one optical property. The surface of the second plastic component forms an optically functional region of the plastic base body, generated, for example, by the addition of pigment, or filler that increases reflection. Thus, by the addition of black pigment an increased contrast can advantageously be obtained. By the addition of white filler, the reflectivity of the front side surface of the plastic base body can be advantageously increased.

In an advantageous embodiment, the plastic base body encloses electrical connection leads of a metal lead frame, such that these extend from the assembly region to the surface of the plastic base body. This assembly region is disposed in a reflector-like cavity of the plastic base body. The second plastic component forms a layer along the entire front side or along a partial area of the front side of the plastic base body except for the reflector-like cavity. In a different advantageous embodiment, this layer is drawn additionally also along at least a partial area of the lateral inner surface into the reflector-like cavity.

The thickness of the layer lies advantageously between 50 µm, inclusive, and 100 µm, inclusive.

In another advantageous embodiment, the second plastic component is manufactured from the same plastic base material as the first plastic component. Thermoplast material or duroplast material are preferably suited as a plastic base material.

In a method according to the invention, a plastic base body is produced by means of a two-component injection-molding method (also called double injection-molding method). In a first step of the process, a supporting part of the plastic base body is preferably produced from a first plastic component, and in a further step, an optically functional region of the plastic base body is produced from a second plastic component. The two plastic components differ from each other in at least one optical property. In an alternative method, these two steps are performed in the reverse sequence.

In the present description, and within the scope of the description of the exemplary embodiments, the term "injection-molding method" includes injection molding processes and injection transfer molding processes, as well as transfer molding processes.

In a method for producing a housing with improved contrast, for example, a pigment is mixed into the second plastic component that imparts to it a different color compared to the first plastic component. A black pigment is particularly suited for this purpose. In another embodiment, in order to improve, for example, the reflectivity of the front side of the housing, the second plastic component is filled with a material that increases the reflectivity.

In a particularly advantageous embodiment of the method, electrical connection leads of a metal lead frame are insert molded into the first plastic component in such a manner that these extend from the assembly region for at least one radiation emitting or radiation detecting body, to the surface of the plastic base body. Subsequently, in a further step, the second plastic component is formed on the first plastic component. In the process, a reflector like cavity, in which the assembly region for the semiconductor body is located, is preferably formed in the first plastic component of the plastic base body. Furthermore, the optically functional region is preferably produced from the same plastic base material as the remaining plastic base body. As already mentioned above, thermoplast material or duroplast material are preferably suited as a plastic base material.

In an optoelectronic component according to the invention, at least one semiconductor body that is suitable for emitting and/or detecting electromagnetic radiation (for example, a light emitting diode, laser diode chip, or a photodiode chip), is fastened in a plastic base body. The plastic base body has on its front side an assembly region for the semiconductor body which is surrounded by a transparent window part, and encapsulates the semiconductor body. Electrical connection leads run from the assembly region to the outer surface of the plastic base body. The semiconductor body is preferably disposed on one of the electrical connection leads. Electrical connection surfaces of the semiconductor body are connected in an electrically conducting manner to the electrical connection leads, for example, on the one hand, by means of an electrical connection layer between a connection surface on the rear side and one of the electrical connection leads, and on the other hand, by means of a bond wire between a connection surface on the front side and a second electrical connection lead. However, the semiconductor body can also be connected otherwise to the connection leads by using suitable electrical connection means. On the front side of the plastic base body, an optically functional region is formed from a material whose optical properties are different from those of the remaining material of the plastic base body.

The optical function area is formed by a free surface of a separate plastic component of the plastic base body, produced for example by adding pigment or reflection-increasing filler to the separate plastic component. Thus, by the addition of black pigment an increased contrast can be advantageously obtained. By the addition of white filler, the reflectivity of the front side of the plastic base body can be advantageously increased.

The assembly region is advantageously disposed in a reflector-like cavity of the plastic base body. In a further advantageous embodiment, the separate plastic component is produced from the same plastic base material as the plastic component(s) which forms(form) the remaining plastic base body. Thermoplast material or duroplast material are preferably suited as a plastic base material.

The separate plastic component forms a layer along the entire front side or along a partial area of the front side of the plastic base body except for the reflector-like cavity. In another advantageous embodiment, this layer is additionally also drawn along at least one partial area of the lateral inner surface into the reflector-like cavity. The thickness of the layer lies preferably between 50 μm, inclusive, and 100 μm, inclusive.

BRIEF DESCRIPTION OF THE DRAWINGS

Further advantages, advantageous embodiments, and further developments of the invention arise from the following explanation of the exemplary embodiments in connection with FIGS. 1 and 2. The Figures show.

In the Figures, equivalent components or components that have the same effect are provided with the same reference numbers in each case. The elements illustrated and their proportions are absolutely not to be regarded as true to scale; rather, individual elements, for example, layers and/or distances, can be represented in exaggerated size or thickness for better illustration and/or comprehension.

DETAILED DESCRIPTION

Figure 1:
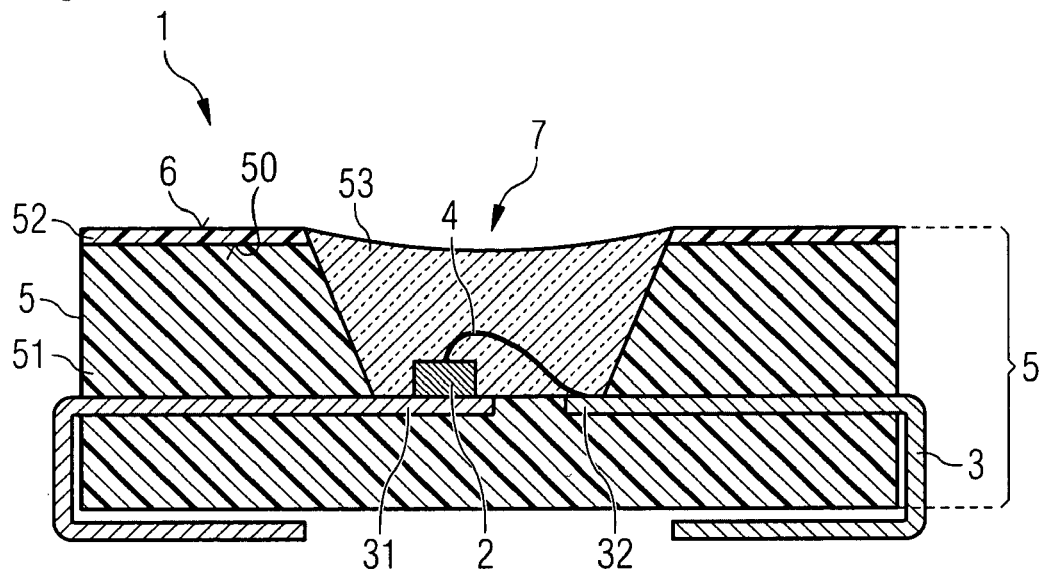
FIG. 1 shows a schematic representation of a section through a first exemplary embodiment.

In the exemplary embodiment according to FIG. 1, a light emitting diode component 1 has a light emitting diode chip 2 that is fastened on an electrical connection lead 31 of an electrical lead frame 3, and is connected to it in an electrically conducting manner via a contact on the rear side. A contact on the front side of the light emitting diode chip 2 is connected to a second electrical connection lead 32 of the electrical lead frame 3 by means of a bond wire 4.

The electrical connection leads 31, 32 are insert molded into a first plastic component 51 of a plastic base body 5. The assembly region for the light emitting diode chip 2 is formed in a reflector-like cavity 7 on the front side 6 of the plastic base body 5. The electrical connection leads 31, 32 extend from the bottom surface of the cavity 7 through the first plastic component 51 to its side surfaces, and there project out beyond it. Outside of the plastic base body 5, the electrical connection leads 31, 32 are bent towards its rear side, and in their further extent are bent onto the backside.

A layer on the front side of the plastic base body 5, whose thickness amounts to, for example, between 50 μm and 100 μm, is formed by a second plastic component 52, whose material differs from the material of the first plastic component 51 in at least one optical property. The surface of the second plastic component 52 forms an optically functional region on the front side 6 of the plastic base body 5. For this purpose, the surface has, for example, at least one pigment and/or at least one reflection increasing filler. Thus, an increase in contrast is achieved with a black pigment. With white filler, such as titanium oxide, for example, the reflectivity of the surface on the front side of the plastic base body 5 is increased.

The second plastic component 52 covers the entire front side 50 of the first plastic component 51 alongside the reflector-like cavity 7. In expedient embodiments (not illustrated), only a part of the front side 50 can be covered by the second plastic component.

The second plastic component 52 is produced from the same plastic base material as the first plastic component 51, for example, from thermoplast material or duroplast material. The plastic base material is, for example, a material based on epoxy resin or acrylic resin, but can also be any other material suited for plastic base bodies of the so-called premold design.

A window part 53 that is produced from, for example, a transparent or translucent plastic material, for example, of a reaction resin such as epoxy resin or silicon resin, is located in the reflector-like cavity 7. This window part encapsulates the light emitting diode chip 2 and serves, among other things, to protect against adverse effects due to environmental influences.

The plastic base body 5, the window part 53, and the lead frame 3 together form the housing of the light emitting diode component 1.

Figure 2:
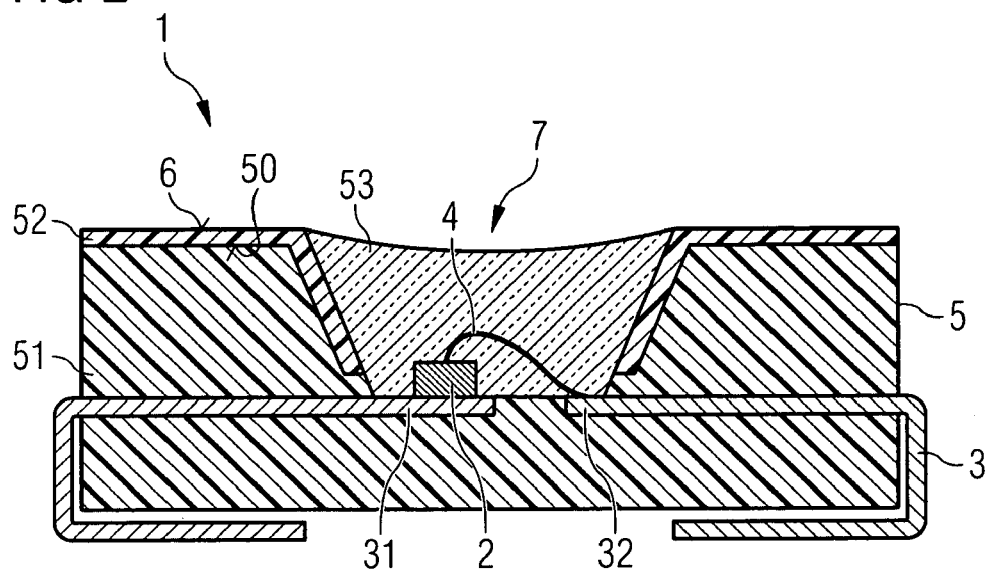
FIG. 2 shows a schematic representation of a section through a second exemplary embodiment.

The exemplary embodiment according to FIG. 2 differs from the embodiment according to FIG. 1, in particular, in that the layer of the second plastic component 52 is drawn into the reflector-like cavity 7, such that a part of the lateral inner surface of the cavity 7 is formed by a surface of the second plastic component 52. The materials of the exemplary embodiment according to FIG. 2 correspond, for example, to those of the exemplary embodiment according to FIG. 1, described above.

Both exemplary embodiments for the housing described above can also be used for photodiode elements. For this purpose, a photodiode chip is used in place of the light emitting diode chip.

In a method for producing a housing for a component according to the exemplary embodiments described above, a plastic base body 5 is produced by means of a two-component injection-molding method (also called double injection-molding method). For this purpose, the first plastic component 51 is produced in a first step as a supporting part of the plastic base body 5. Then, in a further step, the second plastic component 52, which has the optically functional region of the plastic base body 5, is produced. The two plastic components 51, 52 differ from each other, as explained in more detail in connection with the exemplary embodiments above, in at least one optical property.

In the method, in the first step, the electrical connection leads 31, 32 of the metal lead frame 3 are insert molded into the first plastic component 51 such that these extend from the assembly region for the light emitting diode chip 2 to the side surfaces of the plastic base body 5. Subsequently, the second plastic component 52 is formed at the front side of the first plastic component 51.

The invention is not limited by the description based on the exemplary embodiments. Rather, the invention comprises each new feature, as well as any combination of features, which includes, in particular, every combination of features in the patent claims, even if this feature or this combination itself is not explicitly specified in the patent claims or exemplary embodiments.

The invention claimed is:

1. A housing for an optoelectronic component, the housing comprising:
    a plastic base body having a front side with an assembly region for mounting at least one radiation emitting or radiation detecting body, wherein the plastic base body comprises a first plastic component and a second plastic component, wherein:
    the second plastic component is disposed on the front side of the plastic base body,
    the second plastic component is formed of a material that differs from the first plastic component in at least one optical property,
    the second plastic component forms an optically functional region of the plastic base body,
    the assembly region is disposed in a reflector-like cavity of the plastic base body,
    the second plastic component is a layer that extends along at least a portion of the front side of the plastic base body except for the reflector-like cavity, and
    the layer also runs along at least a partial area of sidewall surfaces of the reflector-like cavity.

2. The housing according to claim 1, wherein the material of the second plastic component has a pigment that imparts a different color to the optically functional region relative to a remaining part of the plastic base body.

3. The housing according to claim 2, wherein the material of the second plastic component is colored black.

4. The housing according to claim 1, wherein the material of the second plastic component is filled with a material that increases reflectivity.

5. The housing according to claim 1, wherein the plastic base body encloses electrical connection leads of a lead frame, and the electrical connection leads extend from the assembly region to a surface of the plastic base body.

6. The housing according to claim 1, wherein the optically functional region is produced from a plastic base material and a remaining part of the plastic base body is produced from the same plastic base material.

7. A light emitting diode component comprising:
    a semiconductor body that is suitable for emitting light,
    a plastic base body that has an assembly region on a front side thereof, the semiconductor body located at the assembly region, wherein, on the front side, an optically functional region of the plastic base body is formed from a material whose optical properties are different from those of remaining material of the plastic base body,
    a light transparent window part adjacent the assembly region, and
    electrical connection leads that extend from the assembly region to an outer surface of the plastic base body and that are connected in an electrically conducting manner to the electrical connection surfaces of the semiconductor body,
    wherein the assembly region is disposed in a reflector-like cavity of the plastic base body,
    wherein the optically functional region comprises a layer that extends along at least a portion of the front side of the plastic base body except for the reflector-like cavity, and
    wherein the layer also runs along at least a partial area of sidewall surfaces of the reflector-like cavity.

8. The light emitting diode component according to claim 7, wherein the material of the optically functional region comprises a pigment that imparts a different color to the optically functional region relative to the remaining material of the plastic base body.

9. The light emitting diode component according to claim 8, wherein the material of the optically functional region is colored black.

10. The light emitting diode component according to claim 7, wherein the material of the optically functional region is filled with a material that increases reflectivity.

11. The light emitting diode component according to claim 7, wherein the plastic base body encloses the electrical connection leads, the electrical connection leads being of a lead frame.

12. The light emitting diode component according to claim 7, wherein the assembly region is disposed in a reflector-like cavity of the plastic base body.

13. The light emitting diode component according to claim 7, wherein the optically functional region is produced from a plastic base material and the remaining material of the plastic base body is produced from the same plastic base material.

14. The housing according to claim 1, wherein the second plastic component has a thickness in the range of 50 μm and 100 μm.

15. The light emitting diode component according to claim 7, wherein the layer in the optically functional region has a thickness in the range of 50 μm and 100 μm.

* * * * *